(12) United States Patent
Mizushima et al.

(10) Patent No.: US 8,043,945 B2
(45) Date of Patent: Oct. 25, 2011

(54) METHOD OF FABRICATING SEMICONDUCTOR DEVICE

(75) Inventors: Ichiro Mizushima, Kanagawa (JP);
Shinji Mori, Kanagawa (JP); Masahiko Murano, Kanagawa (JP); Tsutomu Sato, Oita (JP); Takashi Nakao, Kanagawa (JP); Hiroshi Itokawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/401,453

(22) Filed: Mar. 10, 2009

(65) Prior Publication Data

US 2009/0263957 A1 Oct. 22, 2009

(30) Foreign Application Priority Data

Mar. 11, 2008 (JP) ................................ 2008-061064

(51) Int. Cl.
*H01L 21/20* (2006.01)
*H01L 21/36* (2006.01)
(52) U.S. Cl. .................... 438/507; 438/482; 438/485
(58) Field of Classification Search .............. 438/478, 438/482, 485, 507
See application file for complete search history.

(56) References Cited

U.S. PATENT DOCUMENTS

| | | | |
|---|---|---|---|
| 4,579,621 A | 4/1986 | Hine | |
| 5,864,161 A | 1/1999 | Mitani et al. | |
| 6,217,650 B1 | 4/2001 | Hirose et al. | |
| 6,395,621 B1 * | 5/2002 | Mizushima et al. | 438/486 |
| 6,617,226 B1 | 9/2003 | Suguro et al. | |
| 7,122,864 B2 | 10/2006 | Nagano et al. | |
| 7,202,142 B2 | 4/2007 | Lee et al. | |
| 7,682,940 B2 * | 3/2010 | Ye et al. | 438/478 |
| 2003/0215570 A1 * | 11/2003 | Seutter et al. | 427/255.394 |
| 2005/0066892 A1 * | 3/2005 | Dip et al. | 118/715 |
| 2005/0266631 A1 | 12/2005 | Kim et al. | |
| 2008/0026549 A1 * | 1/2008 | Kim et al. | 438/503 |
| 2008/0237732 A1 | 10/2008 | Mori et al. | |
| 2009/0011570 A1 | 1/2009 | Mizushima et al. | |

FOREIGN PATENT DOCUMENTS

JP 2006-013428 1/2006

* cited by examiner

*Primary Examiner* — Matthew Smith
*Assistant Examiner* — John M Parker
(74) *Attorney, Agent, or Firm* — Finnegan, Henderson, Farabow, Garrett & Dunner, L.L.P.

(57) ABSTRACT

A method of fabricating a semiconductor device according to one embodiment includes: exposing a surface of a semiconductor substrate to a halogen-containing gas that contains at least one of Si and Ge, the semiconductor substrate being provided with a member comprising an oxide and consisting mainly of Si; and exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface.

14 Claims, 10 Drawing Sheets

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-061064, filed on Mar. 11, 2008, the entire contents of which are incorporated herein by reference.

BACKGROUND

In recent years, a technique to epitaxially grow a Si-based crystal such as a SiGe crystal, etc., on a Si-based substrate or a Si-based crystal layer is often used for fabricating a semiconductor device.

For example, in a technique described in JP-A-2006-13428, by epitaxially growing a SiGe crystal having a lattice constant larger than that of a Si crystal at a position sandwiching a channel region of a p-type transistor, a compressive stress is generated in the channel region and thereby straining the channel region. As a result, it is possible to improve carrier (hole) mobility in the channel region, thereby improving an operating speed of the p-type transistor.

BRIEF SUMMARY

A method of fabricating a semiconductor device according to one embodiment includes: exposing a surface of a semiconductor substrate to a halogen-containing gas that contains at least one of Si and Ge, the semiconductor substrate being provided with a member comprising an oxide and consisting mainly of Si; and exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface.

DETAILED DESCRIPTION

Embodiment

The embodiment includes a method for forming a Si-containing crystal film or a Ge-containing crystal film on a semiconductor substrate provided with a member made of an oxide. The method has a halogen-containing gas flowing step and a source gas flowing step implemented after the halogen-containing gas flowing step. Here, the Si-containing crystal film is, e.g., a Si compound crystal film such as SiGe, etc., or a Si crystal film, and the Ge-containing crystal film is, e.g., a Ge crystal film.

The halogen-containing gas flowing step is a step of flowing the halogen-containing gas into a chamber in which a semiconductor substrate is placed, and of exposing the semiconductor substrate to a halogen-containing gas atmosphere. Here, the semiconductor substrate is a substrate made of a crystal consisting mainly of Si, such as a Si substrate, etc. In addition, a member made of an oxide is, e.g., a mask material made of $SiO_2$, or an element isolation region. Furthermore, the member made of an oxide is not limited to a member located on a surface of the semiconductor substrate in which a Si-containing crystal film is formed, but also includes a member located on an opposite surface thereof, etc.

In addition, the halogen-containing gas is a gas containing halogen such as Cl or F, etc., and Si or Ge, and it is possible to use, e.g., dichlorosilane ($SiH_2Cl_2$), monochlorosilane ($SiH_3Cl$), trichlorosilane ($SiHCl_3$), tetrachlorosilane ($SiCl_4$), hexachlorodisilane ($Si_2Cl_6$) and germanium tetrafluoride ($GeF_4$), etc.

The source gas flowing step is a step of epitaxially growing the Si-containing crystal film or the Ge-containing crystal film on the semiconductor substrate by reacting the source gas containing a constituent element of the Si-containing crystal film or the Ge-containing crystal film. For example, when a SiGe crystal film is grown as the Si-containing crystal film, the source gases of Si and Ge are used. It is possible to use monosilane ($SiH_4$), disilane ($Si_2H_6$) and trisilane ($Si_3H_8$), etc., for the source gas of Si. Meanwhile, it is possible to use monogermane ($GeH_4$), digermane ($Ge_2H_6$) and trigermane ($Ge_3H_8$), etc., for the source gas of Ge.

A specific example of a method for forming the above Si-containing crystal film or Ge-containing crystal film is shown as follows. In this example, a 100 nm-thick SiGe crystal film containing 20 At % of Ge is formed as a Si-containing crystal film. Note that, the present embodiment is not limited to the following example.

Figure 1:
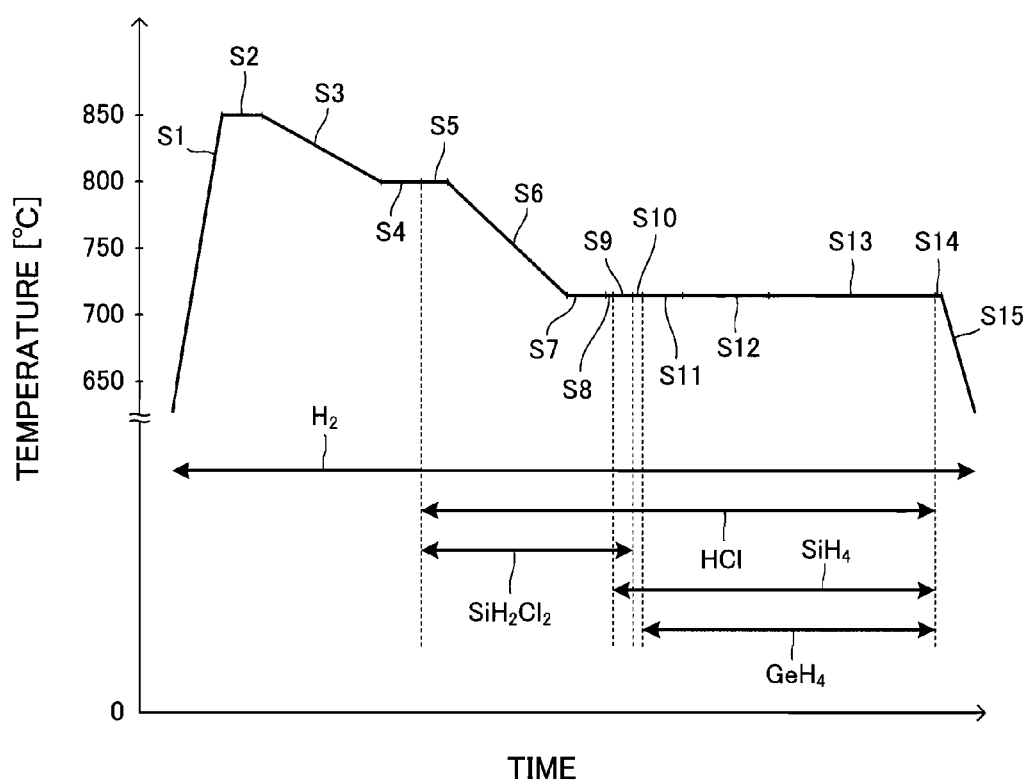
FIG. 1 is a graph showing a process sequence for fabricating a semiconductor device according to an embodiment.

FIG. 1 is a graph showing a process sequence of the example. A polygonal curve on the upper side of the figure represents variations in temperature conditions over time, and double-arrow lines on the lower side represent timings of flowing each gas (hydrogen, hydrogen chloride, dichlorosilane, monosilane and monogermane).

Here, steps S5-S10 in the figure correspond to the halogen-containing gas flowing step, and dichlorosilane is used as the halogen-containing gas. In addition, steps S11-S15 in the figure correspond to the source gas flowing step, monosilane is used as a source gas of Si and monogermane is used as a source gas of Ge.

In this example, a single-crystal Si substrate of which principal surface is (100) is used as the semiconductor substrate. A pattern of the Si oxide film is formed on the semiconductor substrate, and a percentage (hereinafter, percentage X) of an area on the semiconductor substrate covered by the Si oxide film to a sum of the area covered by the Si oxide film and an exposed area of semiconductor substrate is about 83%. Note that, the SiGe crystal film is formed on the exposed region of the semiconductor substrate not covered by the Si oxide film.

Firstly, after loading the semiconductor substrate having the pattern of the Si oxide film formed thereon into a single-wafer processing chamber heated to 600° C., vacuuming is carried out once, and subsequently, a pressure is controlled to be 10 Torr in a state that 25 slm of hydrogen ($H_2$) is flowing. Here, the hydrogen is a gas used for removing a natural oxide film on the surface of the semiconductor substrate, etc., and alternatively, nitrogen or argon, etc, may be used instead of the hydrogen.

Next, a chamber temperature is raised to 850° C. (step S1), and is maintained for 60 seconds for removing the natural oxide film on the surface of the semiconductor substrate (step S2).

Next, the chamber temperature is lowered to 800° C. in 180 seconds (step S3) and is maintained for 60 seconds for stabilizing the temperature (step S4). In addition, the pressure is increased to 15 Torr in the step S4.

Next, dichlorosilane ($SiH_2Cl_2$) and hydrogen chloride (HCl) are each flowed at a flow rate of 70 sccm and 120 sccm, then, the hydrogen flow rate is increased to 30 slm, the Si crystal film that becomes a seed film is started to be formed at a pressure of 10 Torr and this state is maintained for 40 seconds (step S5). Note that, a deposition rate of the Si crystal film under this condition is about 0.5 nm/min, and a thickness of the Si crystal film is thin enough compared with the final thickness of the SiGe crystal film (100 nm). Here, the hydrogen chloride is started to flow at the stage earlier than the source gas of Si (monosilane in this example). As a result, it is possible to suppress Si grain formation on an insulating film such as the Si oxide film, etc., and to form a crystal film only on the exposed surface of the semiconductor substrate.

Next, the chamber temperature is lowered to 715° C. in 180 seconds (step S6) and is maintained for 60 seconds for stabilizing the temperature (step S7). In addition, the dichlorosilane flow rate is reduced to 100 sccm in the step 6. Then, the pressure is reduced to 10 Torr in the step S7.

Next, the dichlorosilane flow rate is reduced to 30 sccm in 10 seconds while maintaining the chamber temperature at 715° C. (step S8).

Next, the monosilane ($SiH_4$) is started to flow while maintaining the chamber temperature at 715° C., and the flow rate thereof is increased from 10 sccm to 50 sccm in 30 seconds (step S9). In addition, the supply of the dichlorosilane is stopped in the step S9.

Next, after maintaining this state for 15 seconds (step S10), the SiGe crystal film is started to be grown by starting to flow the monogermane ($GeH_4$) at the flow rate of 50 sccm, then, this state is maintained for 60 seconds (step S11). Note that, the deposition rate of the SiGe crystal film is 5 nm/min.

Next, the monogermane flow rate is increased to 170 sccm in 132 seconds (step S12), and is maintained for 250 seconds (step S13).

Next, the supplies of hydrogen chloride, monosilane and monogermane are stopped in 10 seconds (step S14), and after lowering the temperature to around 600° C. (step S15), a wafer is taken out from the chamber.

Note that, when the Si crystal film is formed, for example, the use of monogermane is omitted in the above example. Meanwhile, when the Ge crystal film is formed, for example, a gas containing Ge such as germanium tetrafluoride ($GeF_4$), etc., is used as a halogen-containing gas, the use of monosilane is omitted, and the monogermane is started to flow in the step S9 in the above example.

Figure 2A:
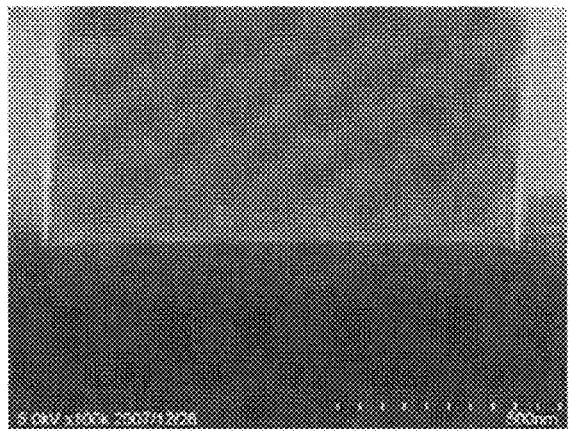
FIGS. 2A and 2B are a SEM photo of a SiGe crystal film according to the embodiment and a contour diagram thereof.
Figure 2B:
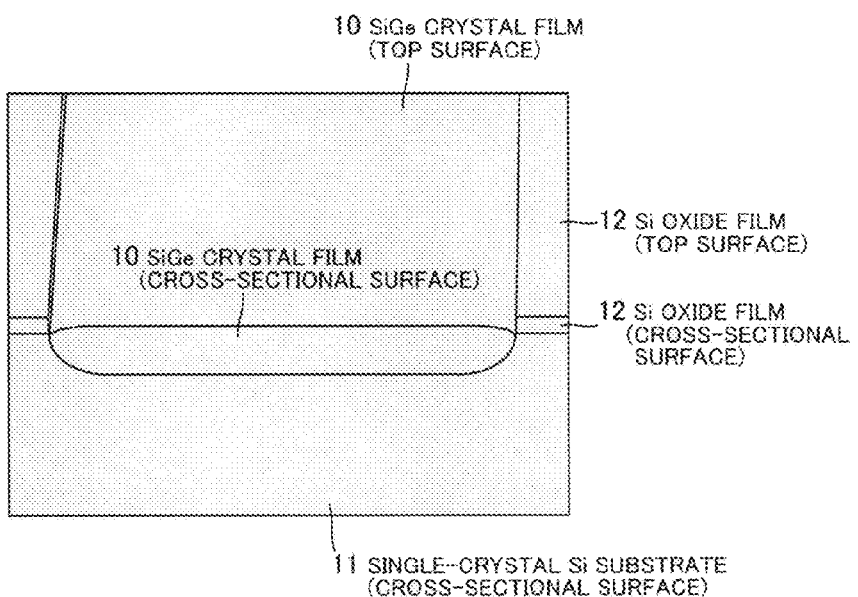
Figure 3A:
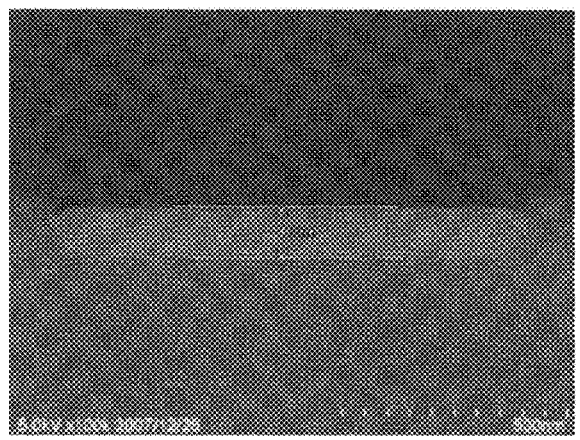
FIGS. 3A and 3B are a SEM photo of a SiGe crystal film according to the embodiment and a contour diagram thereof.
Figure 3B:
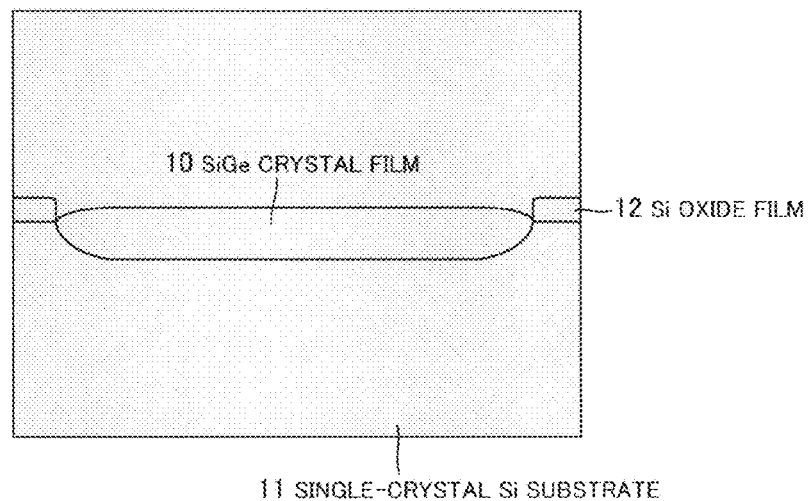

FIGS. 2A and 3A are SEM (Scanning Electron Microscope) photos of the SiGe crystal film that is formed based on the above example of the method for forming the Si-containing crystal film. Meanwhile, FIGS. 4A and 5A are SEM photos of the SiGe crystal film that is prepared as a comparative example and is formed by a conventional method not including the halogen-containing gas flowing step.

Figure 4A:
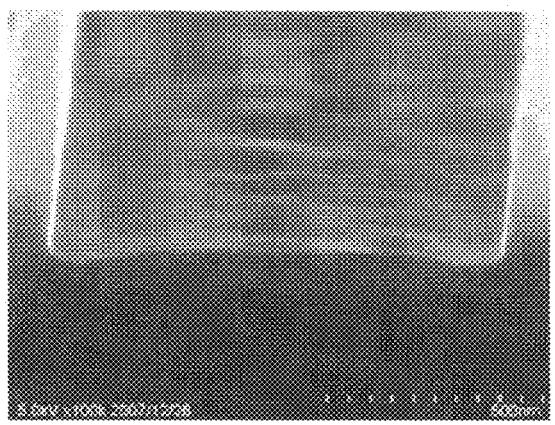
FIGS. 4A and 4B are a SEM photo of a SiGe crystal film as a comparative example and a contour diagram thereof.
Figure 4B:
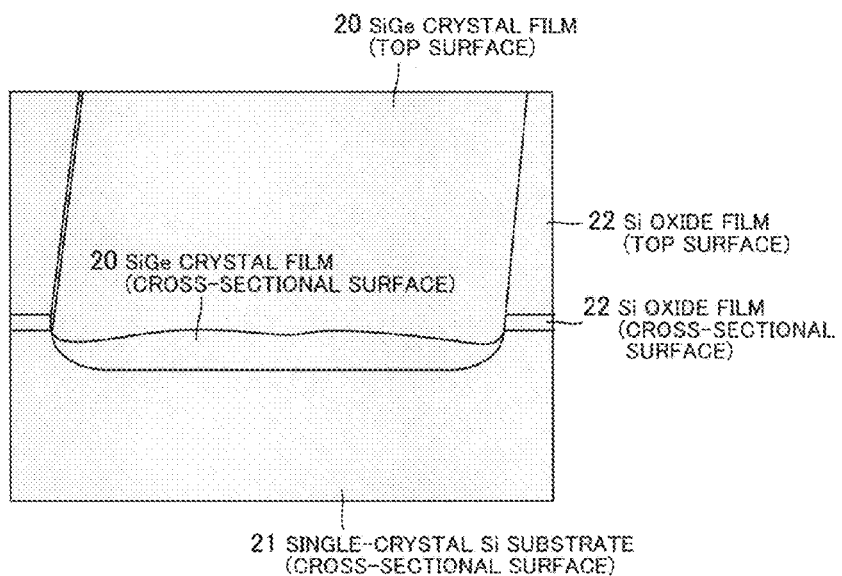
Figure 5A:
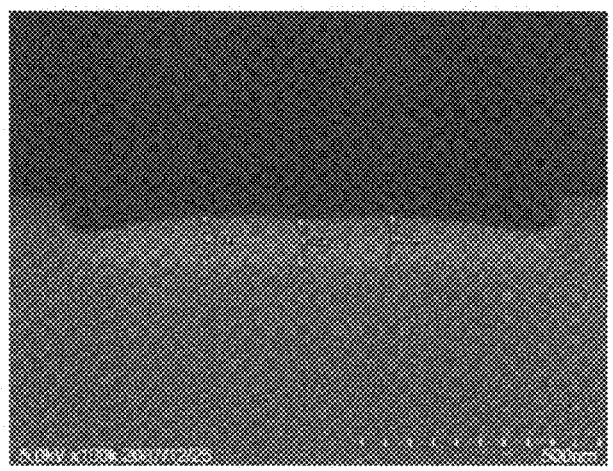
FIGS. 5A and 5B are a SEM photo of a SiGe crystal film as a comparative example and a contour diagram thereof.
Figure 5B:
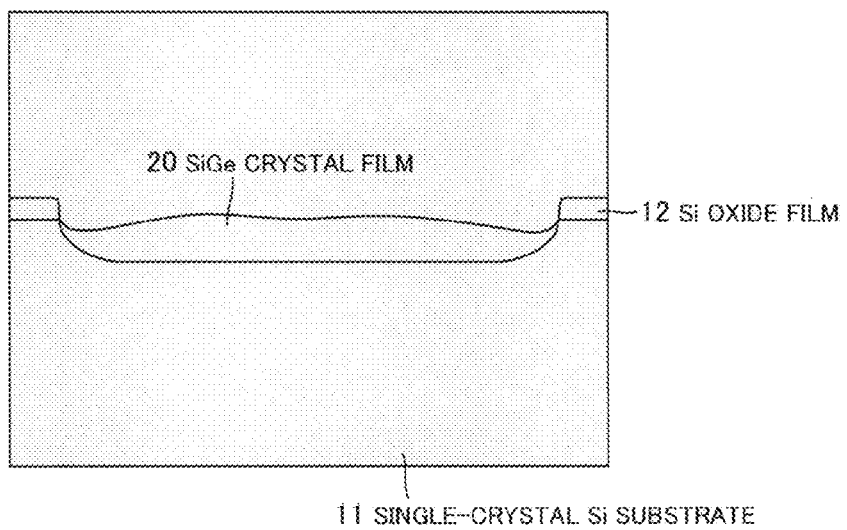

Note that, FIGS. 2A and 4A are photos of an upper surface and a cross-sectional surface taken from the oblique upper direction, and FIGS. 3A and 5A are photos of cross-sectional surfaces taken from the side thereof. In addition, FIGS. 2B, 3B, 4B and 5B are contour diagrams of FIGS. 2A, 3A, 4A and 5A, respectively.

A SiGe crystal film 10 shown in FIGS. 2A, 2B, 3A and 3B is formed on a region of a single-crystal Si substrate 11 not covered by a Si oxide film 12. Similarly, a SiGe crystal film 20 shown in FIGS. 4A, 4B, 5A and 5B is formed on a region of a single-crystal Si substrate 21 not covered by a Si oxide film 22. From these figures, it is understood that the SiGe crystal film is selectively grown only on a surface of the single-crystal Si substrate, i.e., a so-called selective growth occurs in either case.

As shown in FIGS. 2A, 2B, 3A and 3B, a surface of the SiGe crystal film 10 that is formed using a method including the halogen-containing gas flowing step has almost no unevenness and is smooth. On the other hand, as shown in FIGS. 4A, 4B, 5A and 5B, a surface of the SiGe crystal film 20 that is formed using a method not including the halogen-containing gas flowing step is remarkably uneven.

Figure 6A:
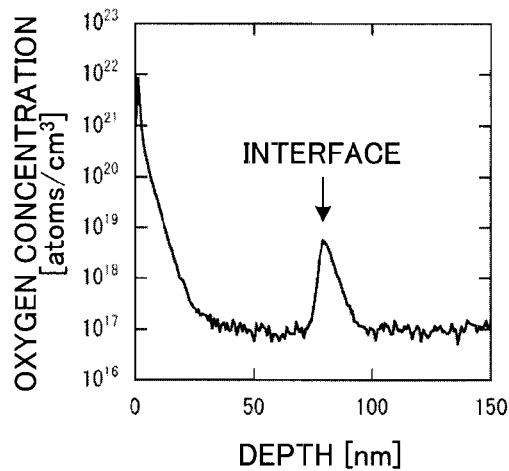
FIGS. 6A and 6B are SIMS profiles showing a concentration of oxygen contained in a single-crystal Si substrate and the SiGe crystal film as a comparative example.
Figure 6B:
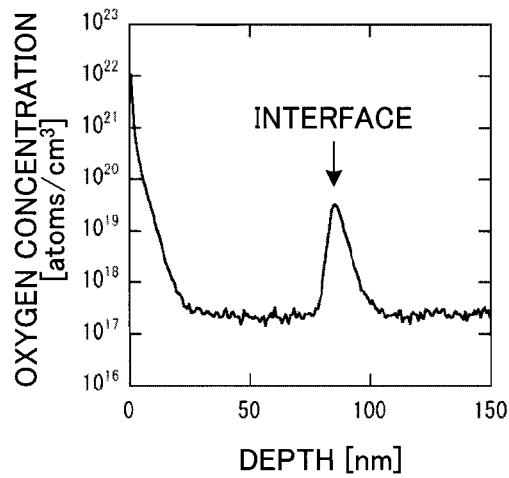

FIGS. 6A and 6B are SIMS (Secondary Ion Mass Spectrometry) profiles as a comparative example showing a concentration of oxygen contained in the single-crystal Si substrate provided with the Si oxide film on the surface thereof and the SiGe crystal film formed on the single-crystal Si substrate using a conventional method not including the halogen-containing gas flowing step. A vertical axis in each figure represents an oxygen concentration and a horizontal axis represents a depth from the surface of the SiGe crystal film in a direction vertical to the surface of the single-crystal Si substrate.

Here, FIGS. 6A and 6B each show data when the percentages X of an area on the single-crystal Si substrate covered by the Si oxide film to a sum of the area covered by the Si oxide film and an exposed area of the Si substrate are 83% and 92%.

Figure 8:
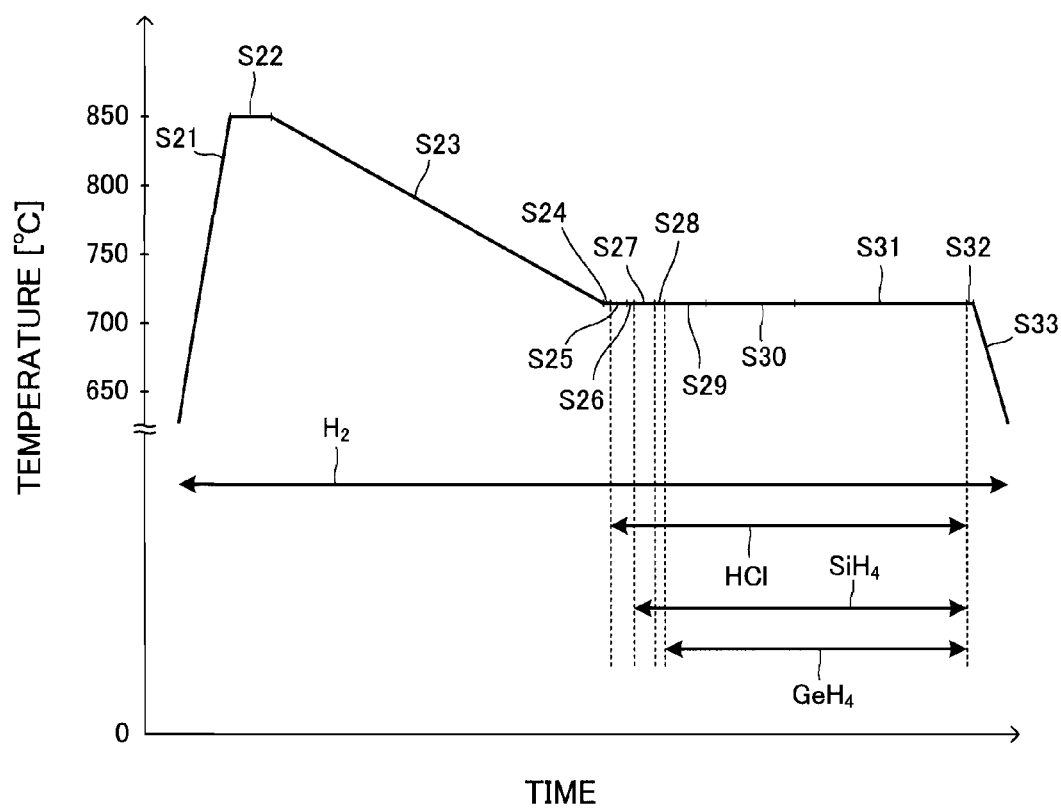
FIG. 8 is a graph showing a process sequence for fabricating the SiGe crystal film as a comparative example.

Note that, the SiGe crystal film shown in the photo of FIGS. 4A and 5A and the SIMS profiles of FIGS. 6A and 6B is formed according to the process sequence shown in FIG. 8. This process sequence corresponds to a process sequence in which a step of flowing the dichlorosilane is omitted from the process sequence for fabricating the SiGe crystal film according to the example of the present embodiment shown in FIG. 1. In detail, steps of stabilizing the temperature once and of flowing the dichlorosilane (steps S4 and S5) are omitted, and a step of continuously lowering the temperature (step S23) is included. In addition, after stopping the temperature decrease and sequentially maintaining the temperature for a predetermined time (step S24), the hydrogen chloride is started to flow before starting to flow the monosilane (step S25). This is for preventing a crystal film from being formed in a region other than the surface of the single-crystal Si substrate such as the Si oxide film, etc. Note that, other steps are same as the process sequence shown in FIG. 1, the steps S21 and S22 each correspond to the steps S1 and S2 in FIG. 1, and the steps S26-S33 each correspond to the steps S8-S15 in FIG. 1.

Figure 7:
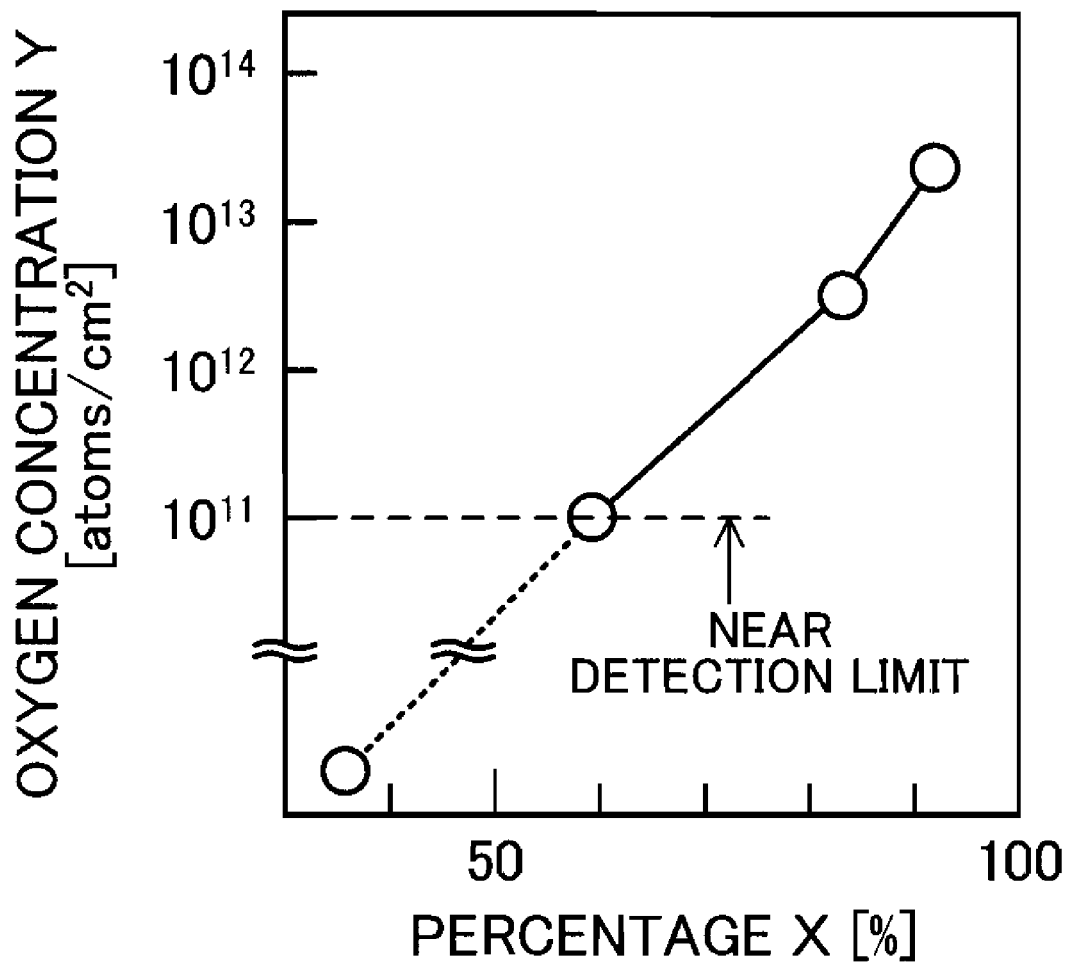
FIG. 7 is a graph showing a relation between a percentage X of an area on a semiconductor substrate covered by a Si oxide film to a sum of the area covered by the Si oxide film and an exposed area of a Si substrate, and an oxygen concentration Y at the vicinity of an interface between the Si substrate and the SiGe crystal film.

FIG. 7 is a graph showing a relation between the above percentage X and an oxygen concentration (hereinafter, oxygen concentration Y) at the vicinity of the interface between the Si substrate and the SiGe crystal film. As shown in FIG. 7, when the percentages X are 36%, 60%, 83% and 92%, each of the oxygen concentrations Y is unknown (immeasurable since it is below the detection limit), about $1 \times 10^{11}$ atoms·cm$^{-2}$, about $3 \times 10^{12}$ atoms·cm$^{-2}$ and about $2 \times 10^{13}$ atoms·cm$^{-2}$, hence, the larger the percentage X, the higher the oxygen concentration Y. Note that, the oxygen concentration of about $1 \times 10^{11}$ atoms·cm$^{-2}$ is substantially equal to the detection limit thereof, and it is confirmed that the oxygen concentration Y is almost completely below the detection limit when the percentage X is 50% or less. Furthermore, it is confirmed that the result shown in FIG. 7 is obtained regardless of a ratio of the sum of the area covered by the Si oxide film and the exposed area of the Si substrate to the whole area of the Si substrate.

From this result, it is considered that the oxygen contained in the Si oxide film is mixed as an impurity in a portion of the single-crystal Si substrate that is a base for growing the SiGe crystal film. Although a concrete mechanism of this phenomenon is not revealed yet, the following is considered. Namely, it is considered that the surface of the Si oxide film would be slightly etched by flowing the gas such as HCl, and the oxygen which is contained in the Si oxide film and is partially released into the gas phase by the etching would be attached to the exposed surface of the Si. Note that, when the percentages X are 83% and 92%, the oxygen concentration Y (atoms·cm$^{-2}$) is evaluated by integrating a value of the oxygen concentration (atoms·cm$^{-2}$) at the vicinity of the interface between the single-crystal Si substrate and the SiGe crystal film shown in FIGS. 6A and 6B in a depth direction (a direction vertical to the surface of the single-crystal Si substrate).

Note that, although oxygen of about $10^{22}$ atoms·cm$^{-3}$ is detected in the vicinity of the surface of the SiGe crystal film, it only looks as if the oxygen attached to the surface existed also in the film due to knock-on during SIMS measurement. In addition, it looks as if oxygen of about $10^{17}$ atoms·cm$^{-3}$ existed substantially uniformly also in a region other than the interface between the Si substrate and the SiGe crystal film. However, since the lower limit of the SIMS detection is this concentration, it just looks as if the oxygen existed in the film at this concentration, and a value is thus lower in the actual oxygen concentration.

In addition, in accordance with increasing coverage ratio on the single-crystal Si substrate by the Si oxide film, the surface of the SiGe crystal film to be formed becomes more uneven and less smooth. It is considered that this is because lattice matching between the single-crystal Si substrate and the SiGe crystal film decreases due to the oxygen mixed from the inside of the Si oxide film into the single-crystal Si substrate, and many defects are thus contained in the SiGe crystal film to be grown.

Figure 6C:
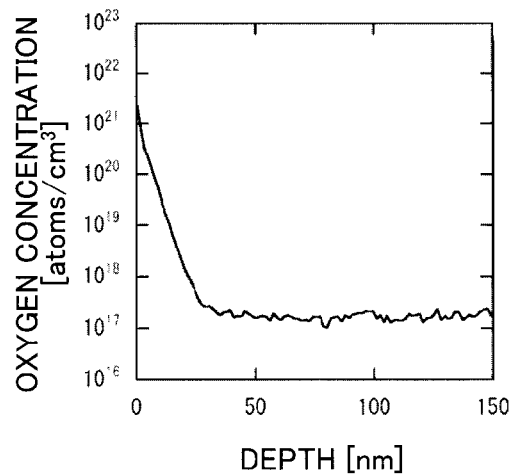
FIG. 6C is a SIMS profile showing a concentration of oxygen contained in the single-crystal Si substrate and a Si crystal film as a comparative example.

As a reference example, FIG. 6C shows a SIMS profile showing a concentration of oxygen contained in the single-crystal Si substrate not provided with the oxide such as Si oxide film, etc., and the Si crystal film formed on the single-crystal Si substrate using a conventional method not including the halogen-containing gas flowing step.

As shown in FIG. 6C, there is no peak of the oxygen concentration (atoms·cm$^{-3}$) at the vicinity of the interface between the single-crystal Si substrate and the Si crystal film. It is considered that this is because, since the oxide such as the Si oxide film, etc., does not exist on the single-crystal Si substrate, the oxygen is hardly mixed as an impurity in a portion of the single-crystal Si substrate that is a base for growing the Si crystal film.

Figure 9:
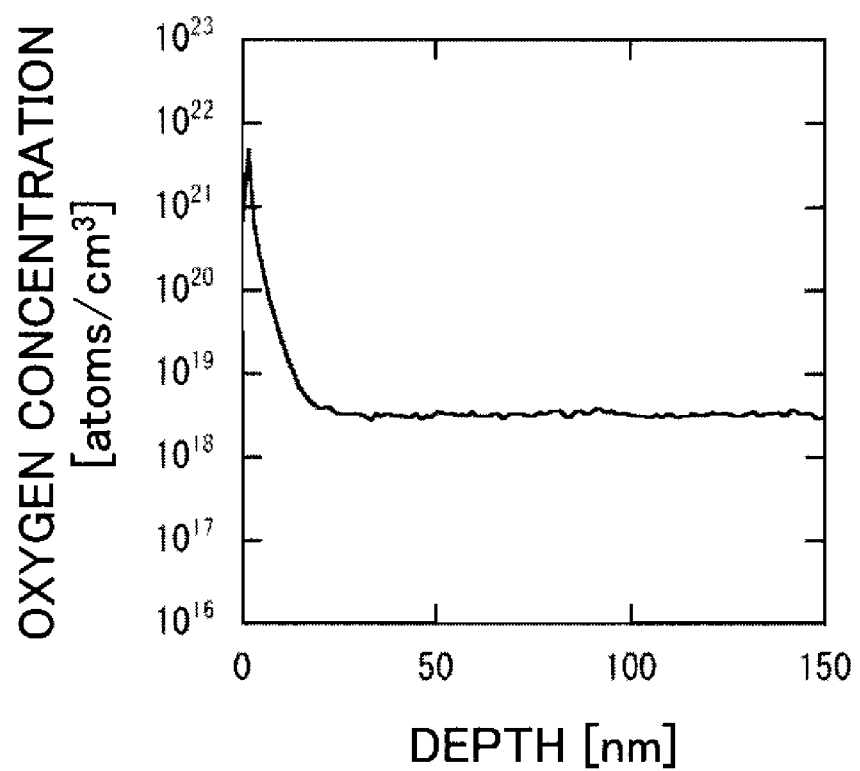
FIG. 9 is a SIMS profile showing a concentration of oxygen contained in the single-crystal Si substrate and the SiGe crystal film according to the embodiment.

FIG. 9 is a SIMS profile showing a concentration of oxygen contained in the single-crystal Si substrate and the SiGe crystal film 10, which is formed on the single-crystal Si substrate using a method including the halogen-containing gas flowing step, shown in FIGS. 2A, 2B, 3A and 3B.

As shown in FIG. 9, even though the percentage X is a high value of 83%, there is no peak of the oxygen concentration (atoms·cm$^{-3}$) at the vicinity of the interface between the single-crystal Si substrate and the SiGe crystal film. Note that, although it looks as if oxygen of about $10^{18}$ atoms·cm$^{-3}$ existed substantially uniformly in the Si substrate and the SiGe crystal film, this is caused due to a high background noise level, and a value is lower in the actual oxygen concentration.

From the above results, it is considered that the reason why the surface of the SiGe crystal film formed using the method including the halogen-containing gas flowing step is smooth is that the halogen-containing gas (dichlorosilane) flowed in the halogen-containing gas flowing step has an effect of preventing the oxygen contained in the Si oxide film from being mixed in a portion of the single-crystal Si substrate that is a base for growing the SiGe crystal film.

Effect of the Embodiment

According to the embodiment, even when the Si-containing crystal film or the Ge-containing crystal film is formed on the semiconductor substrate provided with a member made of an oxide, it is possible to obtain the Si-containing crystal film or the Ge-containing crystal film having a smooth surface and excellent crystal quality by exposing the semiconductor substrate to the halogen-containing gas in the halogen-containing gas flowing step and subsequently exposing to the source gas containing a constituent element of the Si-containing crystal film or the Ge-containing crystal film in the source gas flowing step. In addition, in case of forming the SiGe crystal film using a conventional method not including the halogen-containing gas flowing step, when the percentage X of the area covered by the Si oxide film to the sum of the area covered by the Si oxide film and the exposed area of the Si substrate is more than 50%, the detectable oxygen concentration Y exists at the vicinity of the interface between the Si substrate and the SiGe crystal film, which may adversely affect the crystal quality of the SiGe crystal film. Therefore, the present embodiment is particularly effective when the percentage X is more than 50%. Note that, when the percentage X is more than 50%, the present embodiment is particularly effective not only in the case of forming the SiGe crystal film but also in the case of forming other Si-containing crystal film or Ge-containing crystal film for the same reason.

Furthermore, it is possible to improve the deposition rate of the Si-containing crystal film or the Ge-containing crystal film by using the halogen-containing gas for preventing the oxygen from being introduced into the surface of the semiconductor substrate as well as the source gas containing the constituent element of the Si-containing crystal film or the Ge-containing crystal film without containing halogen. This is because, since the halogen has etching properties, the growth of the crystal film is disturbed if the halogen is supplied during the growth of the crystal film. For example, as is the conventional method, when the gas containing the halogen such as dichlorosilane, etc., is used as a source gas of Si, the halogen is kept supplied during the growth of the crystal film, thus, while it is possible to prevent the oxygen from being introduced into the surface of the semiconductor substrate, the deposition rate of the crystal film is largely decreased.

In addition, according to such a conventional method, it is necessary to grow the crystal film under conditions of high temperature in order to compensate the decrease of the deposition rate, and a sufficient deposition rate is not obtained, e.g., at about 750° C. or less. On the other hand, according to the present embodiment, it is possible to obtain the sufficient deposition rate even, e.g., at about 750° C. or less. Particularly, the present embodiment is more effective when it is necessary to form a film at about 700° C. or less, which is a temperature almost impossible to obtain the deposition rate by the conventional method.

In addition, in general, there is a possibility that a metal remained in a pipe is mixed in a crystal to be grown at a stage of starting to flow the gas into the chamber, however, according to the present embodiment, it is possible to form a Si-containing crystal film or a Ge-containing crystal film that hardly contains a metal impurity. It is considered that this is because it is possible to remove the metal in the form of halide by using the halogen-containing gas.

Note that, the halogen-containing gas used in the halogen-containing gas flowing step may be kept flowed after proceeding to the source gas flowing step, or alternatively, the supply thereof may be stopped before proceeding to the source gas flowing step. A relation between a timing of stopping the halogen-containing gas and an oxygen concentration at the vicinity of an interface between the Si-containing crystal film to be formed and the semiconductor substrate or between the Ge-containing crystal film to be formed and the semiconductor substrate will be described as follows.

Figure 10A:
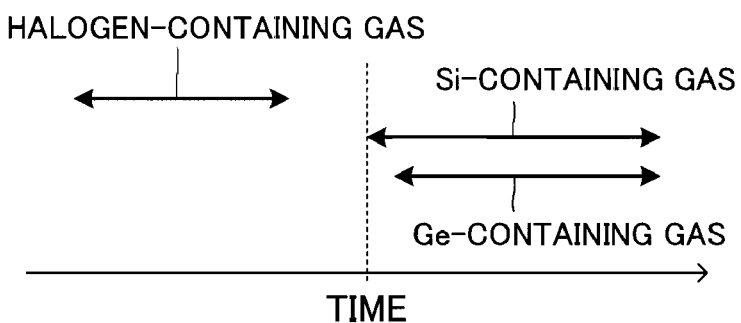
FIGS. 10A and 10B are conceptual views each showing a relation between a timing of stopping supply of a halogen-containing gas and a timing of starting supply of a Si-containing gas.
Figure 10B:
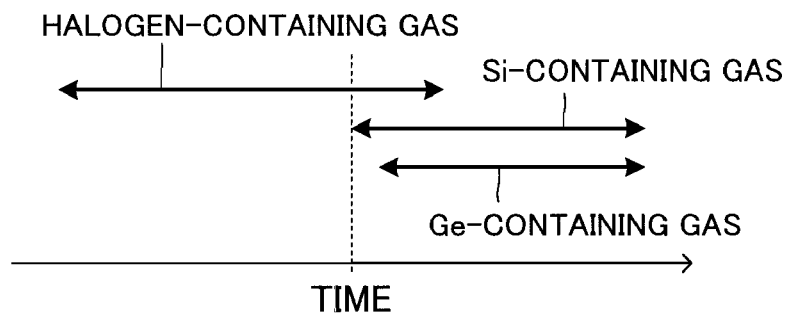

FIGS. 10A and 10B are conceptual views each showing a relation between a timing of stopping the supply of the halogen-containing gas and a timing of starting the supply of the Si-containing gas. A horizontal axis in each figure represents time and double-arrow lines represent timings of flowing each source gas.

FIG. 10A is a conceptual view in case that the supply of the halogen-containing gas is stopped before starting the supply of the Si-containing gas is. Also in this case, an effect by supplying the halogen-containing gas can be obtained. The later the timing of stopping the supply of the halogen-containing gas is, the lower the oxygen concentration at the vicinity of the interface between the semiconductor substrate and the Si-containing crystal film. This is because the effect of the halogen-containing gas for preventing the oxygen from being mixed in a portion of the single-crystal Si substrate that is a base for growing the SiGe crystal film is enhanced by retarding the supply of the halogen-containing gas.

FIG. 10B is a conceptual view in case that the supply of the halogen-containing gas is stopped after starting the supply of the Si-containing gas. In this case, since the halogen-containing gas is supplied also at the time of starting the supply of the Si-containing gas, it is preferable because the oxygen concentration at the vicinity of the interface between the semiconductor substrate and the Si-containing crystal film can be suppressed to be lower. Note that, since halogen has etching properties, the deposition rate of the Si-containing crystal film is decreased while the halogen-containing gas is supplied. In addition, when the crystal film is formed by supplying the Si-containing gas without stopping the supply of the halogen-containing gas, time required for forming the Si-containing crystal film increases depending on the combination of the halogen-containing gas and the Si-containing gas. It is considered that this is because, when, for example, the dichlorosilane is used for the halogen-containing gas and the monosilane is used for the Si-containing gas, these gases react in the gas phase, thereby forming the monochlorosilane, etc., which is less likely to be decomposed. Therefore, as shown in FIG. 10B, by stopping the supply of the halogen-containing gas after starting the supply of the Si-containing gas, it is possible to suppress the oxygen concentration at the vicinity of the interface between the semiconductor substrate and the Si-containing crystal film to be low, and to improve throughput by reducing the time required for forming the Si-containing crystal.

From the above results, it is preferred that the timing of stopping the supply of the halogen-containing gas coincides with or is after the timing of starting the supply of the Si-containing gas from the viewpoint of smoothing the surface of the Si-containing crystal film. Furthermore, form the viewpoint of smoothing the surface of the Si-containing crystal film and improvement in the deposition rate of the Si-containing crystal film, it is preferable that the timing of stopping the supply of the halogen-containing gas is substantially coincided with the timing of starting the supply of the Si-containing gas. Note that, when the Ge crystal film is formed using only the Ge-containing gas as a source gas, the Si-containing gas in FIGS. 10A and 10B is simply replaced with the Ge-containing gas.

Other Embodiments

It should be noted that the present invention is not intended to be limited to the above-mentioned embodiment, and the various kinds of changes thereof can be implemented by those skilled in the art without departing from the gist of the invention.

What is claimed is:

1. A method of fabricating a semiconductor device, comprising:
   exposing a surface of a semiconductor substrate to a halogen-containing gas that contains at least one of Si and Ge, the semiconductor substrate being provided with a member comprising an oxide and consisting mainly of Si; and
   exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface;
   wherein a timing of finishing the exposure of the surface of the semiconductor substrate to the halogen-containing gas substantially coincides with a timing of starting the exposure of the surface to the atmosphere.

2. The method of fabricating a semiconductor device according to claim 1, wherein the epitaxial growth of the crystal film is carried out under a temperature condition of 750° C. or less.

3. The method of fabricating a semiconductor device according to claim 1, wherein the halogen-containing gas contains at least one halogen of Cl and F.

4. The method of fabricating a semiconductor device according to claim 3, wherein the halogen-containing gas contains at least one of dichlorosilane ($SiH_2Cl_2$), monochlorosilane (SiH$_3$Cl), trichlorosilane (SiHCl$_3$), tetrachlorosilane (SiCl$_4$) and hexachlorodisilane (Si$_2$Cl$_6$).

5. The method of fabricating a semiconductor device according to claim 1, wherein the halogen-containing gas contains germanium tetrafluoride (GeF$_4$).

6. The method of fabricating a semiconductor device according to claim 1, wherein the Si-containing gas contains at least one of monosilane (SiH$_4$), disilane (Si$_2$H$_6$) and trisilane (Si$_3$H$_8$).

7. A method of fabricating a semiconductor device, comprising:
   exposing a surface of a semiconductor substrate to a halogen-containing gas that contains at least one of Si and Ge, the semiconductor substrate being provided with a member comprising an oxide and consisting mainly of Si; and
   exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface;
   wherein the epitaxial growth of the crystal film includes growing a Si crystal film by exposing the surface of the semiconductor substrate to the Si-containing gas, growing a Ge crystal film by exposing the surface of the semiconductor substrate to the Ge-containing gas, or growing a SiGe crystal film by exposing the surface of the semiconductor substrate to the Si-containing gas and the Ge-containing gas; and
   a timing of finishing the exposure of the surface of the semiconductor substrate to the halogen-containing gas substantially coincides with a timing of starting the exposure of the surface to the atmosphere.

8. The method of fabricating a semiconductor device according to claim 7, wherein the epitaxial growth of the crystal film is carried out under a temperature condition of 750° C. or less.

9. The method of fabricating a semiconductor device according to claim 7, wherein the halogen-containing gas contains at least one halogen of Cl and F.

10. The method of fabricating a semiconductor device according to claim 9, wherein the halogen-containing gas contains at least one of dichlorosilane (SiH$_2$Cl$_2$), monochlorosilane (SiH$_3$Cl), trichlorosilane (SiHCl$_3$), tetrachlorosilane (SiCl$_4$) and hexachlorodisilane (Si$_2$Cl$_6$).

11. The method of fabricating a semiconductor device according to claim 7, wherein the halogen-containing gas contains germanium tetrafluoride (GeF$_4$).

12. The method of fabricating a semiconductor device according to claim 7, wherein the Ge-containing gas contains at least one of monogermane (GeH$_4$), digermane (Ge$_2$H$_6$) and trigermane (Ge$_3$H$_8$).

13. A method of fabricating a semiconductor device, comprising:
   exposing a surface of a semiconductor substrate to a halogen-containing gas that contains at least one of Si and Ge, the semiconductor substrate being provided with a member comprising an oxide and consisting mainly of Si; and
   exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface;
   wherein a timing of finishing the exposure of the surface of the semiconductor substrate to the halogen-containing gas coincides with or is after a timing of starting the exposure of the surface to the atmosphere;
   the atmosphere contains the Si-containing gas and the Ge-containing gas; and
   a timing of starting the exposure of the surface of the semiconductor substrate to the Si-containing gas is before a timing of starting the exposure of the surface to the Ge-containing gas.

14. A method of fabricating a semiconductor device, comprising:
   exposing a surface of a semiconductor substrate to a halogen-containing gas that contains at least one of Si and Ge, the semiconductor substrate being provided with a member comprising an oxide and consisting mainly of Si; and
   exposing the surface of the semiconductor substrate to an atmosphere containing at least one of a Si-containing gas not containing halogen and a Ge-containing gas not containing halogen after starting exposure of the surface of the semiconductor substrate to the halogen-containing gas, thereby epitaxially growing a crystal film containing at least one of Si and Ge on the surface;
   wherein the epitaxial growth of the crystal film includes growing a Si crystal film by exposing the surface of the semiconductor substrate to the Si-containing gas, growing a Ge crystal film by exposing the surface of the semiconductor substrate to the Ge-containing gas, or growing a SiGe crystal film by exposing the surface of the semiconductor substrate to the Si-containing gas and the Ge-containing gas;
   a timing of finishing the exposure of the surface of the semiconductor substrate to the halogen-containing gas coincides with or is after a timing of starting the exposure of the surface to the atmosphere;
   the atmosphere contains the Si-containing gas and the Ge-containing gas; and
   a timing of starting the exposure of the surface of the semiconductor substrate to the Si-containing gas is before a timing of starting the exposure of the surface to the Ge-containing gas.

* * * * *